(12) United States Patent
Cheng

(10) Patent No.: US 8,190,222 B2
(45) Date of Patent: May 29, 2012

(54) HOUSING FOR ELECTRONIC DEVICE

(75) Inventor: Chao-Yuan Cheng, Shindian (TW)

(73) Assignee: FIH (Hong Kong) Limited, Kowloon (HK)

( * ) Notice: Subject to any disclaimer, the term of this patent is extended or adjusted under 35 U.S.C. 154(b) by 384 days.

(21) Appl. No.: 12/503,926

(22) Filed: Jul. 16, 2009

(65) Prior Publication Data

US 2010/0264786 A1 Oct. 21, 2010

(30) Foreign Application Priority Data

Apr. 21, 2009 (CN) .......................... 2009 1 0301722

(51) Int. Cl.
*H04M 1/00* (2006.01)
(52) U.S. Cl. ................. 455/575.8; 455/575.1; D14/250; 220/4.02
(58) Field of Classification Search ............... 455/575.1, 455/575.8
See application file for complete search history.

(56) References Cited

U.S. PATENT DOCUMENTS

| | | | | |
|---|---|---|---|---|
| 5,469,982 A | * | 11/1995 | Gordecki et al. | 220/4.02 |
| 5,613,237 A | * | 3/1997 | Bent et al. | 455/351 |
| 6,111,760 A | * | 8/2000 | Nixon | 361/814 |
| 6,876,543 B2 | * | 4/2005 | Mockridge et al. | 455/347 |
| 7,072,624 B2 | * | 7/2006 | Zheng et al. | 455/90.3 |
| 7,511,230 B2 | * | 3/2009 | Cochrane | 174/382 |
| 7,522,889 B2 | * | 4/2009 | Wulff et al. | 455/90.3 |
| 7,557,468 B2 | * | 7/2009 | Frey | 307/130 |
| 7,796,381 B2 | * | 9/2010 | Zuo et al. | 361/679.57 |
| 7,800,891 B2 | * | 9/2010 | Shi et al. | 361/679.01 |
| 7,985,931 B2 | * | 7/2011 | Akama et al. | 174/363 |
| 7,986,982 B2 | * | 7/2011 | Li et al. | 455/575.1 |

FOREIGN PATENT DOCUMENTS

CN 2613948 Y 4/2004

* cited by examiner

*Primary Examiner* — Duc M Nguyen
(74) *Attorney, Agent, or Firm* — Altis Law Group, Inc.

(57) ABSTRACT

A housing for an electronic device includes a main body and an outer cover. The main body is made of rigid materials. The outer cover is made of soft materials. The main body defines a plurality of positioning cutouts. A plurality of engaging hooks are formed on the outer cover. The engaging hooks engage the positioning cutouts of the main body.

20 Claims, 3 Drawing Sheets

HOUSING FOR ELECTRONIC DEVICE

BACKGROUND

1. Technical Field

The present disclosure relates generally to device housings and, more particularly, to a housing for an electronic device.

2. Description of Related Art

Electronic devices are often built in a housing to protect the inner electronic components. A frequently used housing for an electronic device has a main body and an outer layer enveloping the main body. The main body is made of rigid materials, so that the housing has good mechanical strength. The outer layer is made of soft materials, such as flexible plastic, so that the housing has a unique appearance and tactile appeal. The main body and the outer layer can be integrally formed by multi-shot molding or glued together.

However, when the housing is multi-shot molded, the materials of the outer layer must be prevented from dissolving in the materials of the main body, requiring the multi-shot mold to have a complex structure with high manufacturing costs. When the outer layer is glued to the main body, bonding strength between the layers is difficult to guarantee, and considerable time required for the process.

Therefore, there is room for improvement within the art.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
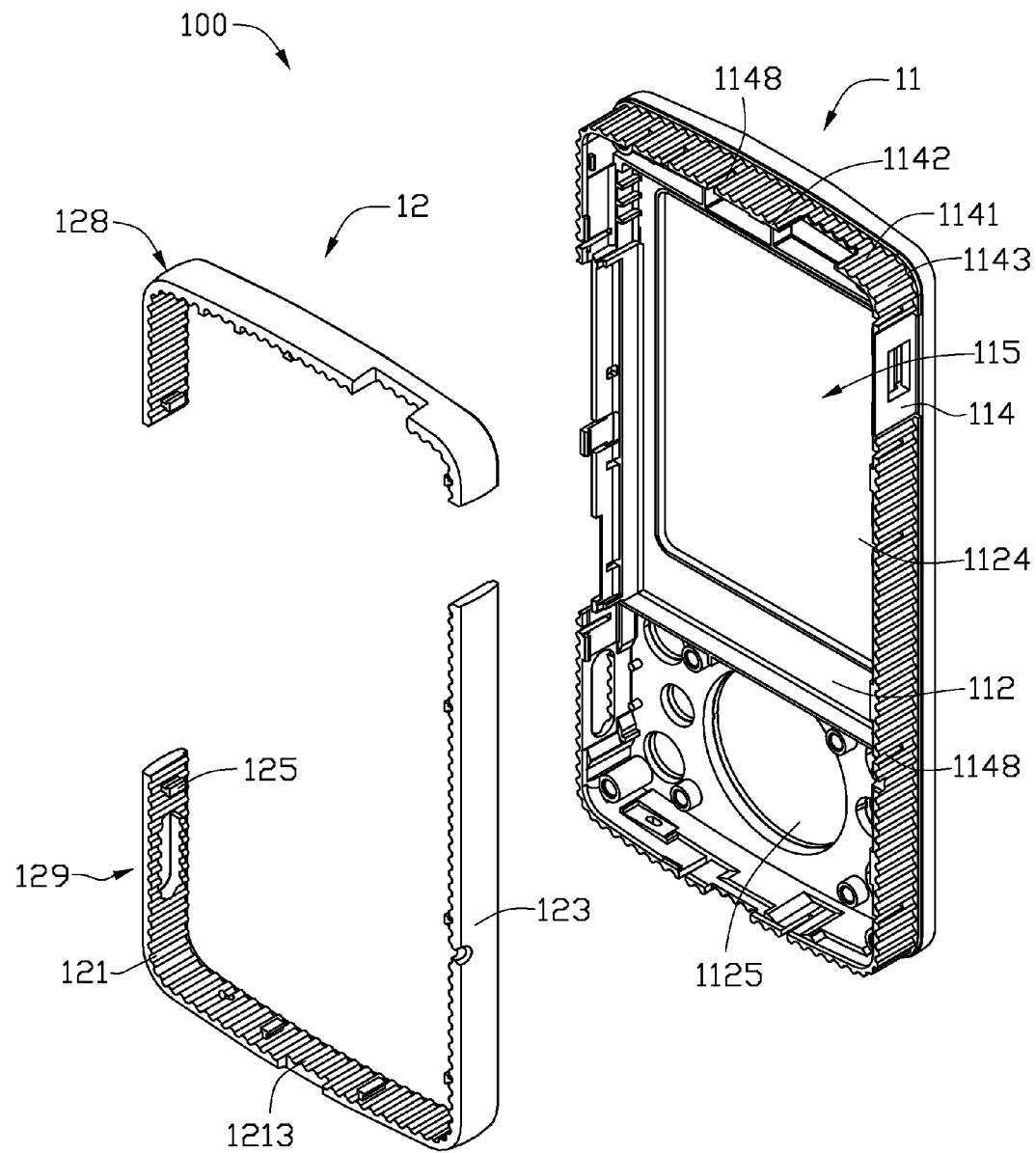
FIG. 1 is an exploded, isometric view of an exemplary embodiment of a housing.
Figure 2:
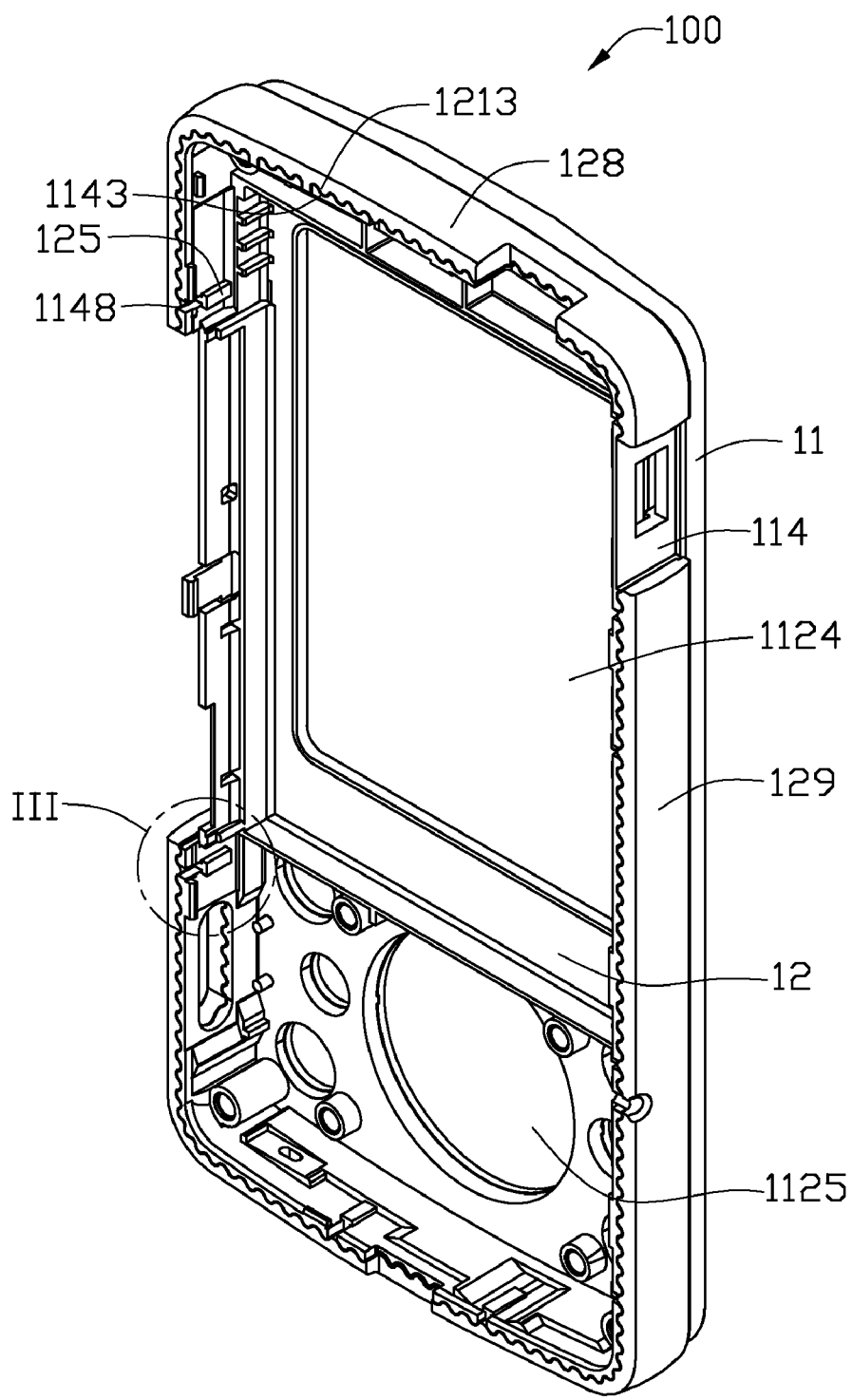
FIG. 2 is an assembled, isometric view of the housing of FIG. 1.

Referring to FIGS. 1 and 2, an exemplary embodiment of a housing 100, for an electronic device, includes a main body 11 and an outer cover 12 engaged with the main body 11. In the illustrated exemplary embodiment, the housing 100 is for a mobile phone (not shown).

The main body 11 includes a base 112 and a sidewall 114 extending from an edge of the base 112. The base 112 and the sidewall 114 cooperatively define a receiving area 115 for seating a circuit board (not shown). The base 112 defines a first assembly cutout 1124 configured to receive a display body (not shown) and a second assembly cutout 1125 configured to receive a keypad (not shown).

The sidewall 114 includes a connecting surface 1141. A plurality of parallel connecting portions 1143 are uniformly formed on the connecting surface 1141. The connecting portions 1143 may be protrusions or grooves, and a cross-section of each connecting portion 1143 perpendicular to an extending axis made of the connecting portions 1143 may be curved or triangular. In the illustrated exemplary embodiment, the connecting portions 1143 are curved elongated grooves. The sidewall 114 also defines a plurality of positioning cutouts 1148, shorter than the connecting portions 1143.

The main body 11 is made of rigid materials, exhibiting good rigidity and mechanical strength. For example, the main body 11 may be made of polycarbonate, acrylonitrile butadiene styrene copolymer, or a combination thereof. The main body 11 may also be made of metallic materials such as magnesium alloy or aluminum alloy.

Figure 3:
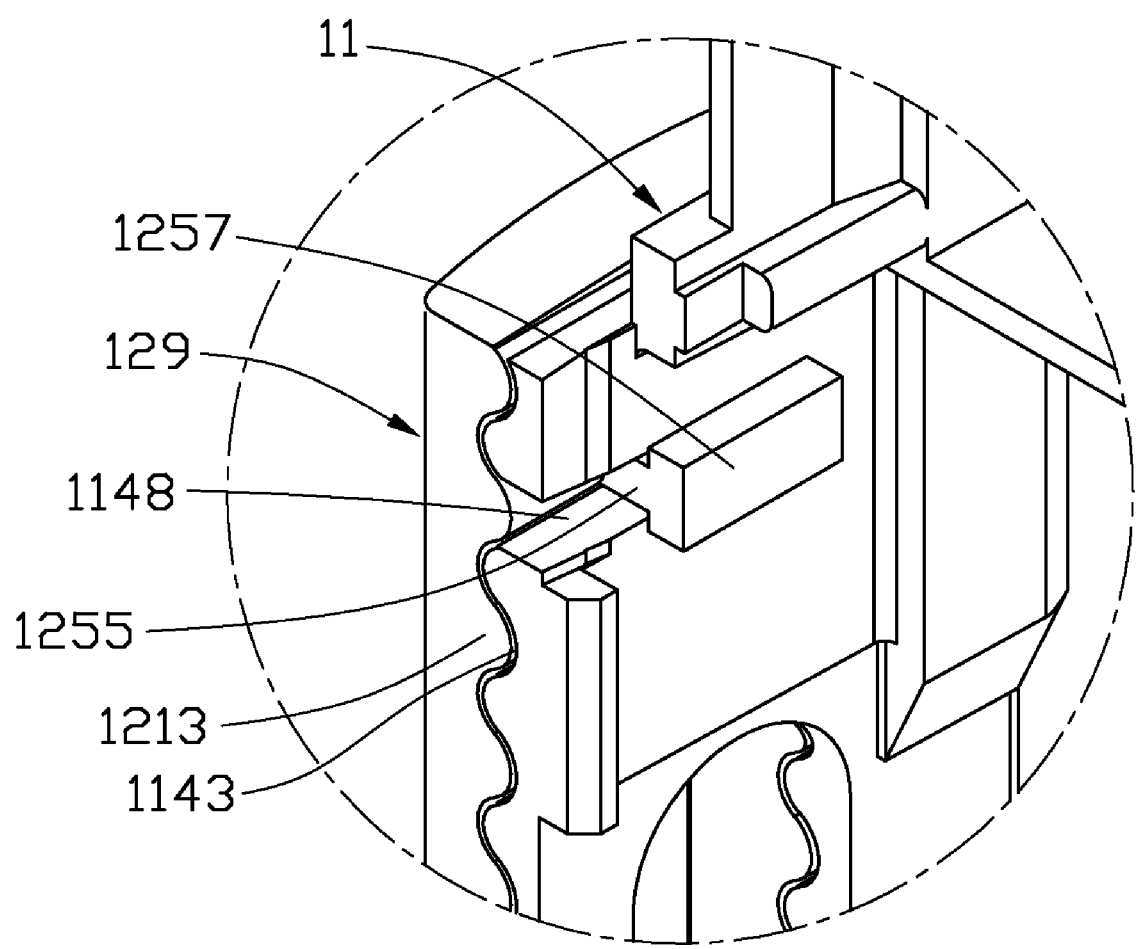
FIG. 3 is an enlarged view of part III of FIG. 2.

The outer cover 12 includes an inner surface 121 and an outer surface 123 opposite to the inner surface 121. The outer surface 123 may be decorative. A plurality of parallel assembly portions 1213 corresponding to the connecting portions 1143 are formed on the inner surface 121. The outer cover 12 also forms a plurality of engaging hooks 125 corresponding to the positioning cutouts 1148. The engaging hooks 125 include an engaging portion 1255 and a restricting portion 1257 (as shown in FIG. 3) substantially perpendicularly extending from an end of the engaging portion 1255. The engaging hooks 125 are elastic, and the engaging portions 1255 are slightly wider than the positioning cutouts 1148, providing snug and secure engagement therebetween. In the illustrated exemplary embodiment, the outer cover 12 includes a first section 128 and a second section 129. The assembly portions 1213 are curved elongated protrusions.

The outer cover 12 is made of a soft material, such as thermoplastic rubber or thermoplastic polyurethane.

Referring to FIGS. 1 through 3, during assembly of the housing 100, the first section 128 is positioned at a top end of the main body 11, with the engaging hooks 125 facing the positioning cutouts 1148 of the sidewall 114. The first section 128 is moved until the engaging hooks 125 engage the positioning cutouts 1148, and the assembly portions 1213 engage the connecting portions 1143. Thus, the first section 128 is fixed to the main body 11. The second section 129 is assembled to a bottom end of the main body 11 as described. After the housing 100 is assembled, the outer cover 12 closely contacts the sidewall 114 of the main body 11.

It should be pointed out that the first section 128 and the second section 129 can be integrally formed, so that the outer cover 12 is easily assembled to the main body 11. In addition, the outer cover 12 may have a plurality of sections, thus able to be manufactured more easily. In addition, the engaging hooks may be formed on the main body 11, and the outer cover 12 define positioning cutouts corresponding to the engaging hooks.

The housing for electronic devices as disclosed has several advantages.

The main body, of rigid materials, provides mechanical strength. The outer cover 12, of soft material, provides tactile appeal and protects the housing 100 and enclosed components from external shock.

The main body and outer cover are separately made and assembled together, so no multi-shot molding is required, keeping manufacturing costs of the housing low.

The outer cover detachably and tightly engages the main body 11, due to elastic deformability thereof.

It is believed that the disclosure and its advantages will be understood from the foregoing description, and it will be apparent that various changes may be made thereto without departing from the spirit and scope of the disclosure or sacrificing all of its material advantages.

What is claimed is:

1. A housing for an electronic device, comprising:
   a main body made of a rigid material and including a plurality of connecting portions, the connecting portions being parallel curved elongated grooves, and correspondingly forming a plurality of elongated protrusions between adjacent ones of the connecting portions, a length of each of the elongated protrusions from one side edge of the main body to another opposite side edge of the main body being equal to a height of the main body;
   an outer cover made of a soft material and including a plurality of assembly portions, the assembly portions being parallel curved elongated protrusions, two ends of each of the assembly portions being respectively substantially coplanar with two side edges of the outer cover;

wherein one of the main body and the outer cover defines at least one positioning cutout, and the other of the main body and the outer cover comprises at least one engaging hook formed thereon, and wherein the at least one engaging hook engages the at least one positioning cutout, and the assembly portions engage with the connecting portions, such that the outer cover is assembled on the main body.

2. The housing of claim 1, wherein each of the at least one engaging hook comprises an engaging portion and a restricting portion substantially perpendicularly extending from an end of the engaging portion; with the engaging portion engaging the positioning cutout.

3. The housing of claim 2, wherein each of the at least one positioning cutout extends substantially parallel to the connecting portions, and the engaging portion and the restricting portion of each of the at least one engaging hook are substantially bar-shaped and extend substantially parallel to the assembly portions.

4. The housing of claim 1, wherein the outer cover comprises a first section and a second section, positioned on opposite ends of the main body.

5. The housing of claim 1, wherein the main body comprises a base and a sidewall extending from an edge of the base, and the base and the sidewall cooperatively define a receiving area.

6. The housing of claim 5, wherein the base defines a first assembly cutout and a second assembly cutout.

7. The housing of claim 5, wherein the sidewall is substantially a rectangular frame, and the connecting portions are formed on an outer surface of the sidewall; the connecting portions communicating with two opposite side edges of the sidewall, and the elongated protrusions extending from one of the two opposite side edges of the sidewall to the other.

8. The housing of claim 7, wherein the outer cover is substantially a rectangular frame surrounding the side wall, and the assembly portions are formed on an inner surface of the outer cover.

9. The housing of claim 5, wherein the at least one positioning cutout is defined in the sidewall, and is shorter than the connecting portions.

10. The housing of claim 1, wherein the assembly portions alternate with the elongated protrusions formed between adjacent ones of the connecting portions.

11. A housing for an electronic device, comprising:
a main body including a plurality of connecting portions, the connecting portions being parallel curved elongated grooves, and correspondingly forming a plurality of elongated protrusions between adjacent ones of the connecting portions, a length of each of the elongated protrusions from one side edge of the main body to another opposite side edge of the main body being equal to a height of the main body;

an outer cover including a plurality of assembly portions, the assembly portions being parallel curved elongated protrusions, two ends of each of the assembly portions being respectively substantially coplanar with two side edges of the outer cover;

wherein the assembly portions engage with the connecting portions, such that the outer cover is assembled on the main body; and wherein the main body defines at least one positioning cutout, and the other cover defines at least one elastic engaging hook, whereby when the at least one engaging hook engages the at least one positioning cutout, the at least one engaging hook is elastically deformed.

12. The housing of claim 11, wherein each of the at least one engaging hook comprises an engaging portion and a restricting portion substantially perpendicularly extending from an end of the engaging portion; and the engaging portion engages the positioning cutout.

13. The housing of claim 12, wherein each of the at least one positioning cutout extends substantially parallel to the connecting portions, and the engaging portion and the restricting portion of each of the at least one engaging hook are substantially bar-shaped and extend substantially parallel to the assembly portions.

14. The housing of claim 11, wherein the outer cover comprises a first section and a second section, positioned on opposite ends of the main body.

15. The housing of claim 11, wherein the main body comprises a base and a sidewall extending from an edge of the base, and the base and the sidewall cooperatively define a receiving groove.

16. The housing of claim 15, wherein the base defines a first assembly cutout and a second assembly cutout.

17. The housing of claim 15, wherein the sidewall is substantially a rectangular frame, and the connecting portions are formed on an outer surface of the sidewall; the connecting portions communicating with two opposite side edges of the sidewall, and the elongated protrusions extending from one of the two opposite side edges of the sidewall to the other.

18. The housing of claim 17, wherein the outer cover is substantially a rectangular frame surrounding the side wall, and the assembly portions are formed on an inner surface of the outer cover.

19. The housing of claim 15, wherein the at least one positioning cutout is defined in the sidewall, and is shorter than the connecting portions.

20. The housing of claim 11, wherein the assembly portions alternate with the elongated protrusions formed between adjacent ones of the connecting portions.

* * * * *